United States Patent
Miyamato et al.

(10) Patent No.: US 8,025,921 B2
(45) Date of Patent: Sep. 27, 2011

(54) METHOD OF FORMING A METAL POWDER FILM A THERMAL CONDUCTION MEMBER, POWER MODULE, VEHICLE INVERTER, AND VEHICLE FORMED THEREOF

(75) Inventors: Noritaka Miyamato, Toyota (JP); Yoshihiko Tsuzuki, Toyota (JP)

(73) Assignee: Toyota Jidosha Kabushiki Kaisha, Aichi (JP)

( * ) Notice: Subject to any disclaimer, the term of this patent is extended or adjusted under 35 U.S.C. 154(b) by 195 days.

(21) Appl. No.: 12/443,055

(22) PCT Filed: Jun. 11, 2008

(86) PCT No.: PCT/JP2008/061066
§ 371 (c)(1),
(2), (4) Date: Mar. 26, 2009

(87) PCT Pub. No.: WO2008/156903
PCT Pub. Date: Dec. 24, 2008

(65) Prior Publication Data
US 2010/0073883 A1  Mar. 25, 2010

(30) Foreign Application Priority Data
Jun. 21, 2007 (JP) .................................. 2007-163771

(51) Int. Cl.
*B05D 1/12* (2006.01)

(52) U.S. Cl. ...... 427/192; 427/190; 427/427; 428/317.9
(58) Field of Classification Search ................ 427/190, 427/192, 427
See application file for complete search history.

(56) References Cited

U.S. PATENT DOCUMENTS

| 5,520,792 | A | * | 5/1996 | Burgess et al. ............... 205/74 |
| 6,139,913 | A | * | 10/2000 | Van Steenkiste et al. ...... 427/191 |
| 2006/0219055 | A1 | * | 10/2006 | Loffelholz et al. ............. 75/255 |
| 2006/0275554 | A1 | * | 12/2006 | Zhao et al. ..................... 427/446 |

FOREIGN PATENT DOCUMENTS

| JP | 2004-076157 A | 3/2004 |
| JP | 2004-307969 A | 11/2004 |
| JP | 2005-095886 A | 4/2005 |

* cited by examiner

*Primary Examiner* — Frederick J Parker
(74) *Attorney, Agent, or Firm* — Sughrue Mion, PLLC

(57) ABSTRACT

There is provided a film forming method capable of enhancing adhesion efficiency of a metal powder by use of a low-pressure compressed gas even in the case of spraying the metal powder remaining in a solid-phase state to a substrate, to form a film, the method being a film forming method of spraying a metal powder p in a solid-phase state to a surface 11a of a substrate 11 along with a compressed gas, to form a film 12 of the metal powder p on the surface 11a of the substrate 11, wherein a powder, which at least contains a powder for film formation having an apparent density of 1.4 to 2.0 g/cm$^3$ and an average grain size of not larger than 25 μm, is used as the metal powder p.

12 Claims, 7 Drawing Sheets

FIG. 4

| | | | Apparent density (g/cm³) | Grain size (μm) | Grain size after granulation (μm) | Adhesion efficiency (%) |
|---|---|---|---|---|---|---|
| Example 1 | Granulated powder | Water-atomized | 1.52 | 2 | 20 | 67.4 |
| Example 2 | | Gas-atomized | 1.88 | 3 | 18 | 69.2 |
| Example 3 | | Electrolytic copper | 1.64 | 4.8 | 22 | 58.7 |
| Example 4 | | | 1.5 | 4.8 | 21 | 62.1 |
| Example 5 | Dendritic powder | Electrolytic copper | 1.64 | 19.3 | — | 79.5 |
| Comparative example 1-1 | Atomized powder | High-pressure swing water-atomized | 4.5 | 18.4 | — | 1 |
| Comparative example 1-2 | | | 5.5 | 4.7 | — | 24.1 |
| Comparative example 1-3 | | | 2.5 | 1.8 | — | 0 |
| Comparative example 1-4 | | Water-atomized | 3.03 | 26 | — | 38.2 |
| Comparative example 1-5 | | | 4.22 | 9.8 | — | 10.2 |
| Comparative example 1-6 | | Gas-atomized | 4.35 | 16 | — | 3.8 |
| Comparative example 2-1 | Granulated powder | Water-atomized | 2.12 | 2 | 19.8 | 43.2 |
| Comparative example 2-2 | | | 1.87 | 5 | 23.4 | 47.6 |
| Comparative example 2-3 | | Gas-atomized | 3.4 | 3 | 26 | 28.8 |
| Comparative example 2-4 | | | 2.08 | 1.52 | 24.4 | 39.7 |
| Comparative example 3-1 | Dendritic powder | Electrolytic copper | 1.95 | 34.8 | — | 24.3 |
| Comparative example 3-2 | | | 1.59 | 6.97 | — | 0 |
| Comparative example 3-3 | | | 1.59 | 27 | — | 41.3 |
| Comparative example 3-4 | Botryoidal powder | | 2.41 | 7.8 | — | 0 |
| Comparative example 3-5 | | | 1.72 | 26 | — | 30.5 |
| Comparative example 3-6 | | | 2.3 | 19 | — | 37.5 |
| Comparative example 3-7 | | | 1.61 | 14.2 | — | 35.7 |

METHOD OF FORMING A METAL POWDER FILM A THERMAL CONDUCTION MEMBER, POWER MODULE, VEHICLE INVERTER, AND VEHICLE FORMED THEREOF

TECHNICAL FIELD

The present invention relates to a film forming method of spraying a metal powder in a solid-phase state to the surface of a substrate along with a compressed gas to form a film containing a composition of the metal powder, a thermal conduction member where a film is formed by the film forming method, a power module comprising the thermal conduction member, a vehicle inverter comprising the power module, and a vehicle comprising the vehicle inverter.

BACKGROUND ART

A power module used in a vehicle inverter and the like has hitherto been constituted of electronic components shown in FIG. 9. Specifically, a power module 70 at least includes a power element 71 made of a silicon element, an insulating member 73 made of aluminum nitride to which the power element 71 is fixed through a solder layer 72, and a heat sink member 74 made of aluminum. Further, between the insulating member 73 and the heat sink member 74, a buffer member 75 made of copper-molybdenum (Cu—Mo) or aluminum-silicon carbide (Al—SiC) is installed for the purpose of transmitting a heat generated from the power element 71 to the heat sink member 74 and dissipating the heat as well as for the purpose of alleviating the difference in thermal expansion between the insulating member 73 and the heat sink member 74. The buffer member 75 is fixed to the insulating member 73 by a solder layer 76, and is fixed to the heat sink member 74 by a silicon grease 77. As thus described, the buffer member 75 in combination with the heat sink member 74 constitutes a thermal conduction member for dissipating the heat from the power element 71.

However, in the power module 70, the silicon grease 77 that fixes the buffer member 75 has lower thermal conductance than those of the other members, and has thus been an obstacle in transmission of the heat from the power element 71 to the heat sink member 74. In order to avoid this, for example, a method can be considered in which copper-molybdenum (Cu—Mo) is metallized directly on the surface of the heat sink member 74 without using the silicon grease 77, to form the buffer member 75 as a film. However, since the metal powder is melt and the melt metal is further sprayed to the substrate in this method, the film is significantly oxidized and the substrate is also significantly thermally affected, whereby the method cannot be the to be preferred.

Thereat, a film forming method called cold spraying has recently been proposed. This cold spraying is a method of increasing a flow rate of a compressed gas heated to a temperature lower than a melting point or a softening temperature of a material for the film by use of a tapered and widened (laval) nozzle, putting a powder as the material for the film into the gas flow for acceleration, and colliding the powder remaining in a solid-phase state with the substrate at a high rate, to form a film (e.g. see JP Patent Publication (Kokai) NO. 6-37438A (1994)).

DISCLOSURE OF THE INVENTION

However, in the case of forming the film by use of the metal powder by cold spraying, since the metal powder is sprayed in the solid-phase state, adhesion efficiency is low. In order to enhance the adhesion efficiency, it has been necessary to increase transformation of the metal powder in collision with the substrate. Specifically, it has been necessary to increase a rate of the metal particles in collision with the substrate, or to increase pressure of the compressed gas at the time of spraying so as to increase pressure of the metal particles in collision with the substrate. In this case, with increase in pressure of the compressed gas, cost of film forming facilities and cost of the compressed gas for use increase. Further, the collision transformation of the metal powder at the time of collision becomes large, thereby making it difficult, for example, to form a desired porous film having multi-functionality (specifically a film in which poles having a desired size are uniformly dispersed).

Meanwhile, as a method for enhancing the adhesion efficiency of the metal powder, a method of heating the metal powder before sprayed to raise a temperature of the metal powder to be collided with the substrate can also be considered. However, in the case of raising the temperature of the metal powder to be collided with the substrate, the metal powder becomes more vulnerable to oxidation, and hence an inherent characteristic of cold spraying, that is to form a film containing a small amount of an oxide, may be impaired.

Further, a method of decreasing a grain size of the metal powder to increase the collision rate of the metal powder that is transferred by the compressed gas can also be considered. However, in the case of decreasing the grain size of the metal powder, the powder may be affected by repercussions of the compressed gas collided with and reflected on the substrate, and consequently, it is difficult to sufficiently increase the rate of the metal powder that is collided with the substrate.

The present invention was made in view of such problems and has an object to provide a film forming method for a film capable of enhancing adhesion efficiency of a metal powder even in the case of spraying the metal powder remaining in a solid-phase state by use of a low-pressure compressed gas to form the film, and also provide a thermal conduction member produced by the film forming method, a power module comprising the thermal conduction member, a vehicle inverter comprising the power module, and a vehicle comprising the vehicle inverter.

In an attempt to solve the above problems, the present inventors turned their attention to a metal powder to be sprayed to a substrate as a method for enhancing adhesion efficiency of a film, and obtained a new finding that the adhesion efficiency improves in a breakthrough manner when a apparent density of the metal powder and an average grain size of the metal powder satisfy certain ranges.

The present invention was made based upon this new finding obtained by the inventors, and a film forming method according to the present invention is a film forming method of spraying a metal powder in a solid-phase state to a surface of a substrate along with a compressed gas, to form a film from the metal powder on the surface of the substrate, characterized in that a powder, which at least contains a powder for film formation having a apparent density of 1.4 to 2.0 g/cm$^3$ and an average grain size (average particle diameter) of not larger than 25 μm, is used as the metal powder.

According to the present invention, by so-called cold spraying, a metal powder in a solid-phase state is transferred to the surface of a substrate along with a compressed gas, with the metal powder remaining unmelted, and is then sprayed to the substrate. By the spraying, the metal powder adheres to and is deposited on the surface so as to be formed as a film. Since the film is formed with the metal powder held in the solid-phase state, it is less vulnerable to oxidation than a film formed by melting a metal powder. As a result of this, it is possible to obtain a metal film having a higher purity on the surface of the substrate, so as to ensure thermal conductance of the film.

Further, as a powder for film formation contained in the metal powder, a powder having an apparent density of 1.4 to 2.0 g/cm$^3$ and an average grain size of not larger than 25 μm is sprayed. Using a powder satisfying the above ranges for the apparent density and the average grain size can improve the adhesion efficiency of the metal powder even in the case of using a low pressure (e.g. on the order of 0.6 MPa) as the compressed gas. As a result of this, due to the improvement in adhesion efficiency of the metal powder, it is not necessary to increase a collision rate, a collision pressure or a temperature of the metal powder at the time of spraying. In particular, using the above powder for film formation facilitates formation of a porous film with poles uniformly dispersed therein on the surface of the substrate. It is to be noted that, as described later, the porous film is effective especially when used for the purpose of alleviating the difference in thermal expansion between members (one is the substrate) thermally expanded due to heat generation of a heating element.

A powder for film formation having the apparent density of less than 1.4 g/cm$^3$ is difficult to produce, and might be pulverized before collided with the substrate. On the other hand, in the case of the apparent density being larger than 2.0 g/cm$^3$, due to a large density of the powder, with increase in grain size of the powder, the powder becomes more difficult to get on a current of the compressed gas, and the adhesion efficiency of the powder to the substrate thus decreases. Further, in the case of the average grain size being larger than 25 μm, sufficient kinetic energy (collision energy) cannot be provided to the powder, and the adhesion efficiency of the powder to the substrate thus decreases. Moreover, the average grain size of the powder for film formation is more preferably not smaller than 1 μm. In the case of the average grain size of the powder for film formation being smaller than 1 μm, the adhesion efficiency of the powder may decrease since being affected by repercussions of the compressed gas sprayed to and reflected on the substrate.

The "apparent density" mentioned in the present invention is also called a bulk density, and refers to a value obtained by filling a fixed-volume container with a metal powder without pressurizing the metal powder by tapping or the like, and dividing a total weight of the filled metal powder by an inner volume of the container filled with the metal powder (volume of the metal powder), and in the present invention, the "apparent density" refers to a loose apparent density (loose bulk density).

In the film forming method according to the present invention, it is more preferable to use, as the powder for film formation, a granulated powder granulated from a power not larger than 10 μm. According to the present invention, the powder for film formation having an average grain size of not larger than 25 μm is granulated from the metal powder having an average grain size of not larger than 10 μm, whereby the powder for film formation is easy to granulate so as to have the above-shown apparent density of 1.4 to 2.0 g/cm$^3$. In the case of forming a film by use of the powder for film formation granulated in such a manner, the film can be formed even using a low-pressure (e.g. on the order of 0.6 MPa) compressed gas, and further, a later-described porous film can be easily formed on the substrate.

Moreover, examples of the granulation method include: a method in which powders not larger than 10 μm are combined using a binder and then agglomerated, and the agglomerated powder is pulverized so as to be granulated; granulation by extrusion; and granulation by rolling, and the granulation method is not particularly restricted but any method can be applied so long as it can satisfy the above ranges for the apparent density and the average grain size.

In the film forming method according to the present invention, it is more preferable to use a gas-atomized powder, a water-atomized powder or an electrolytic powder as a granulated powder to be granulated into the powder for film formation. Especially, the electrolytic powder produced by depositing the metal on an electrode through use of electrolysis has a shape including many concave and convex portions and has spaces on its surface as compared with the other powders, and thus has high adhesion efficiency. Examples of the powder in the above shape include a powder in botryoidal shape (botryoidal powder) and a powder in dendritic shape (dendritic powder). Further, for such a reason, as the powder for film formation in the film forming method according to the present invention, an electrolytic powder which is not granulated and satisfies the above ranges for the apparent density and the average grain size may be used.

Further, although examples of the metal powder include a powder containing at least one material selected from aluminum, chrome, nickel, copper, iron, and alloys of these, a more preferable metal powder is a powder made of copper or a copper alloy. According to the present invention, using the powder made of copper or the copper alloy, can enhance adherability and improve thermal conductance and electric conductance of the film.

Moreover, in the film forming method according to the present invention, a metal powder containing not less than 60% by mass of the powder for film formation is more preferably used as the metal powder. According to the present invention, with the metal powder containing at least not less than 60% by mass of the powder for film formation, the adhesion efficiency of the film can be enhanced. Namely, in the case of the powder for film formation being less than 60% by mass, the adhesion efficiency of the film decreases and the film formation time becomes longer.

In the film forming method according to the present invention, as the compressed gas, a compressed gas having a pressure of 0.4 to 1.0 MPa is more preferably used, and a compressed gas having a pressure of 0.4 to 0.8 MPa is further more preferably used. According to the present invention, using the compressed gas in the above pressure range can form a film suitable for use in the thermal conduction member. Namely, in the case of the pressure of the compressed gas being smaller than 0.4 MPa, adhesion of the metal powder (powder for film formation) becomes difficult, and in the case of the pressure being larger than 1.0 MPa, kinetic energy (collision energy) of the metal powder becomes high and the film formed becomes dense, and hence forming a porous film is difficult. When the pressure of the compressed gas is not larger than 0.4 to 0.8 MPa, a porous film can be easily formed with more reliability.

In the film forming method according to the present invention, it is more preferable to heat the metal powder on a temperature condition of not lower than 50° C. such that the metal powder is sprayed to the surface of the substrate. According to the present invention, the metal powder is heated such that the temperature of the powder to be sprayed to the substrate, namely the temperature of the powder immediately before collided with the substrate, is not lower than 50° C., and the powder remaining in the solid-phase state is formed as a film, thereby allowing further improvement in thermal conductance and electric conductance of the film. It is to be noted that in the case of the temperature of the metal powder being lower than 50° C., the thermal conductance of the formed film decreases. Further, the temperature of the metal powder to be sprayed is preferably not higher than 200° C. In the case of the temperature being higher than 200° C., a ratio of an oxide in the film increases, which may result in an impaired advantage of cold spraying. Further, for setting the metal powder immediately before sprayed at 50 to 200° C., it is more effective to heat the compressed gas to a temperature of 250 to 550° C. and spray the metal powder to the substrate along with the heated compressed gas.

Further, examples of the compressed gas suitable for the film forming method according to the present invention include inert gases, such as nitrogen gas and helium gas, and the air (atmospheric air), and the kind of the compressed gas is not particularly restricted so long as the film can be formed by adhesion and deposition of the metal powder in the solid-phase state and a porous structure can be obtained in the formed film.

The thermal conduction member according to the present invention is a thermal conduction member where a film is formed by the above film forming method, and it is more preferable that the film be a porous film having a porosity of 5 to 50% by volume. According to the present invention, even in a case where a coefficient of thermal expansion of the substrate is different from a coefficient of thermal expansion of a member in contact with the film of the thermal conduction member, since the film formed between these members is porous, a Young's modulus of the film is lower than that of either of these members, and hence the difference in thermal expansion between the substrate and the member in contact with the film of the thermal conduction member can be alleviated. This can result in suppression of peeling of the film on the interface and cracking of the film due to thermal fatigue. Further, in the case of using a copper powder as the metal powder, it is more preferable to form the film such that the density of the film be 4.5 to 8.5 kg/m$^3$. By forming the film so as to have a density in the above density range, it is possible to obtain the foregoing film made of a porous structure having poles of 5 to 50% by volume.

Further, it is preferable to use the thermal conduction member produced by the above production method for a power module, and it is preferable that the substrate of the thermal conduction member be a heat sink member constituting the power module, and the film of the thermal conduction member be arranged between an insulating member mounted with a power element constituting the power module and the heat sink member.

According to the present invention, since the film of the thermal conduction member is arranged between the insulating member and the heat sink member which constitute the power module, it is not necessary to use a silicon grease that inhibits thermal conduction on the surface of the heat sink member, and a generated heat from the power element can be suitably transmitted using the heat sink member. Further, since the film has the porous structure, the difference in thermal expansion between the insulating member and the heat sink member can be alleviated. This can result in improvement in strength of fatigue due to thermal cycles, so that a highly reliable power module can be obtained.

Further, it is preferable to use such a power module for a vehicle inverter required to have high reliability. Moreover, since the thermal conduction member produced by this production method has good thermal conductance, it is effective to use the thermal conduction member for equipment having a heat dissipating configuration, such as an engine part of a vehicle or a CPU of electronic equipment.

The substrate of the thermal conduction member may be applied not only to the heat sink of the power module, but also to heat sinks of a computer and audio equipment, for example.

Specifically, it is preferable to form the film in a portion of the surface of the heat sink, which is bonded to the heater side, among the surface. Further, using the above film forming method, the film may be formed, for example, in a contact point with an electric component, a portion bonded with a dissimilar metal, or the film may be formed on the surface of an ornament, a blade or the like, which is required to have good design properties.

According to the present invention, the adhesion efficiency of the metal powder can be enhanced even in the case of spraying the metal powder remaining in a solid-phase state to the substrate by use of a low-pressure compressed gas so as to form the film.

The present specification includes contents described in the specification and/or the drawings of JP Patent Application No. 2007-163771 as a basis of the priority of the present application.

BRIEF DESCRIPTION OF THE DRAWINGS

FIG. 4 is a view showing results on characteristics and adhesion efficiency of a copper powder.

DESCRIPTION OF SYMBOLS

Figure 1:
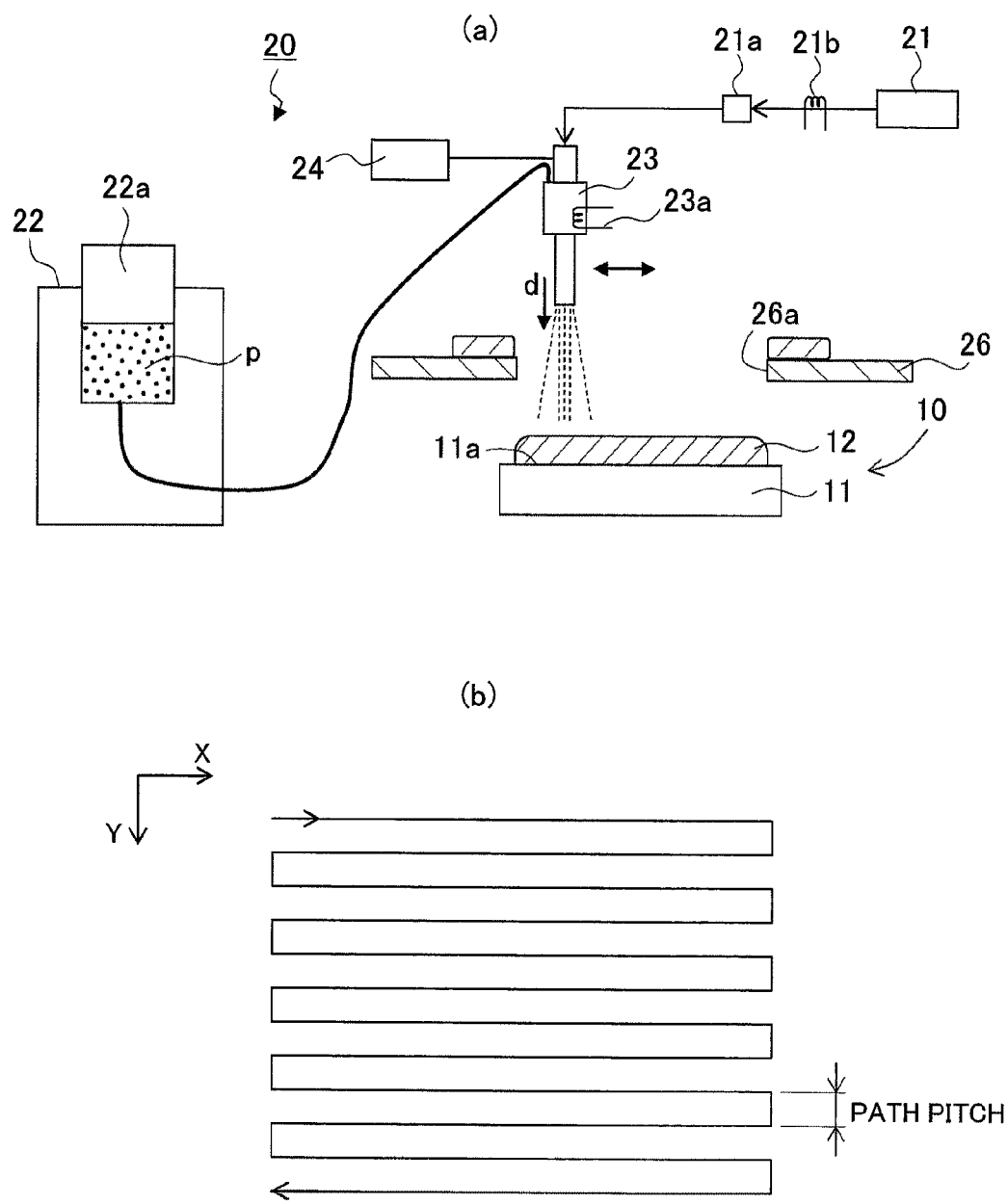
FIG. 1 is a view for explaining a film forming method according to the present embodiment: (a) is a schematic device constitutional view of the film forming method of the present embodiment; and (b) is a view showing a shifting pattern of a nozzle at the time of film formation viewed from the top surface of a substrate.

Reference numeral 10 designates a thermal conduction member, 11 designates a substrate, 12 designates a film, 30 designates a power module, 32 designates a buffer member, 40 designates an inverter, 71 designates a power element, 73 designates an insulating member, and reference character p designates a copper powder (metal powder).

BEST MODE FOR CARRYING OUT THE INVENTION

In the following, an embodiment of a film forming method according to the present invention is described in detail with respect to drawings. FIG. 1 is a view for explaining a film forming method according to the present embodiment: (a) is a schematic device constitutional view of the film forming method of the present embodiment; and (b) is a view showing a shifting pattern of a nozzle at the time of film formation viewed from the top surface of a substrate.

A thermal conduction member 10 according to the present embodiment is a member where a film 12, obtained by adhesion of a copper powder p in a solid-phase state to an aluminum-made substrate 11 and deposition of the powder thereon, is formed and can be produced by using a film forming device 20 as shown in FIG. 1. The film forming device 20 at least comprises a compressed gas supplying means 21, a copper powder supplying means 22, a nozzle 23, and a nozzle shifting means 24.

The compressed gas supplying means 21 is a means for supplying the compressed gas to the later-described nozzle 23, and connected to the nozzle 23 through a pressure adjustment valve 21a that adjusts pressure of the compressed gas. Further, examples of the compressed gas supplying means 21 include a bomb filled with the air, an inert gas or the like, and a compressor that compresses the atmospheric air, and one capable of supplying the nozzle 23 with the compressed gas on a pressure condition of 0.4 to 1.0 MPa is preferred. This is because, in the case of less than 0.4 MPa, the film is difficult to form, and in the case of larger than 0.1 MPa, not only film formation facilities having pressure resistance is required, but also a later-described film formed becomes dense, and it becomes difficult to form a porous film as described later.

Further, a heating means 21b for heating the compressed gas is further installed on the downstream side of the compressed gas supplying means 21. The compressed gas is heated by the heating means 21b so that the later-described copper powder p can be sprayed to the substrate 11 on a desired temperature condition. It is to be noted that the heating means 21b functions to indirectly heat the copper powder p by means of the compressed gas, and may be arranged inside the compressed gas supplying means 21, and so long as the copper powder can be heated to a desired temperature by use of a later-described heater 23a, the heating means 21b is not necessarily provided.

In the copper powder supplying means 22, a copper powder to be sprayed to the substrate 11 is housed in the hopper 22a, and the copper powder supplying means 22 is connected to the nozzle 23 such that the copper powder p can be supplied to the nozzle 23 in a prescribed supplied amount. The copper powder p that is housed in the copper powder supplying means 22 has an apparent density of 1.4 to 2.0 g/cm$^3$, and contains not more than 60% by mass of a powder for film formation, having an average grain size of not larger than 25 μm, with respect to a total of the copper powder p. Further, the powder for film formation is an electrolytic powder or a granulated powder granulated from a powder not larger than 10 p.m. Moreover, in the case of granulating a powder, a granulated powder obtained by granulating a gas-atomized powder, a water-atomized powder or an electrolytic powder is more preferred.

Further, the nozzle 23 is connected to the nozzle shifting means 24, and by driving the nozzle shifting means 24, the nozzle 23 can be shifted along a later-described route as shown in FIG. 1(b). Moreover, inside the nozzle 23, the heater 23a for heating the supplied copper powder p is provided.

Using the film forming device 20, the thermal conduction member 10 is produced by the following method. In the present embodiment, first, the substrate 11 is arranged below a masking plate 26 having a rectangular opening 26a. It is to be noted that the opening 26a is formed so as to have an area corresponding to a rectangular film formation programmed region 11a on the surface of the substrate 11. The substrate 11 is then arranged such that the opening 26a agrees with the film formation programmed region 11a of the substrate 11 in a spraying direction d.

Next, the pressure of the compressed gas is adjusted to not larger than 1.0 MPa by the pressure adjustment valve 21a, and the compressed gas is also heated to a prescribed temperature by the heating means 21b, and the compressed gas is then supplied to the nozzle 23. Meanwhile, the copper powder is housed in the hopper 22a of the copper powder supplying means 22, and then supplied from the copper powder supplying means 22 to the nozzle 23. The compressed gas is previously heated by the heating means 21b such that the copper powder is sprayed to the surface of the substrate on a temperature condition of 50 to 200° C. at the time of spraying, and the copper powder is also heated by the heater 23a inside the nozzle 23, to adjust the temperature of the copper powder.

Then, as shown in FIG. 1(b), the nozzle 23 is linearly shifted in a prescribed shifting direction (X-axial direction in the figure) with respect to the surface (X-Y plain) of the substrate 11, and is next shifted in a perpendicular direction (Y-axial direction in the figure) with respect to the above direction, and these shifts are repeated as a series, to spray the copper powder to the film formation region of the substrate 11 so as to form the film 12. In such a condition, through the nozzle 23, the copper powder in the solid-phase state is sprayed to the surface of the substrate 11 along with the compressed gas, to form the film 12 on the surface of the substrate 11.

The film formed in such a manner is capable of improving adhesion efficiency of a metal powder by use of the above powder for film formation even in the case of using low pressure (e.g. on the order of 0.6 MPa) as the compressed gas, and is capable of easily forming a porous film with poles uniformly dispersed therein.

Figure 2:
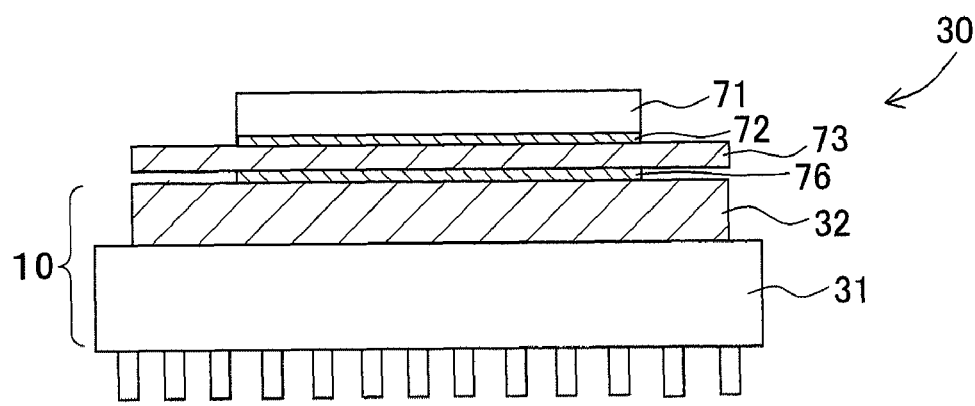
FIG. 2 is a view for explaining a power module to which a thermal conduction member produced according to the present embodiment is applied.
Figure 9:
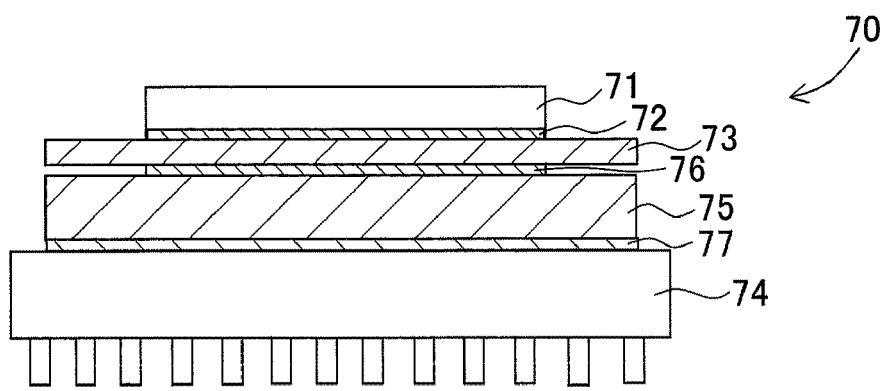
FIG. 9 is a view for explaining a conventional power module.

FIG. 2 is a view for explaining a power module to which a thermal conduction member produced according to the present embodiment is applied. It is to be noted that the same members as the members constituting the power module 70 already shown in FIG. 9 are provided with the same numerals, and detailed descriptions thereof are omitted.

As shown in FIG. 2, a power module 30 comprises the thermal conduction member 10 produced by the above method, and an aluminum-made substrate constituting the thermal conduction member is included in a heat sink member 31 constituting the power module 30. Further, a copper-made film with a porous structure which constitutes the thermal conduction member is arranged as a buffer member 32 between the aluminum-made insulating member 73 mounted with the power element 71 and the heat sink member 31.

As thus described, since the film of the thermal conduction member is arranged between the insulating member 73 and the heat sink member 31 which constitute the power module 30, it is not necessary to use a silicon grease that inhibits thermal conduction on the surface of the heat sink member 31, and the generated heat from the power element 71 can be suitably transmitted using the heat sink member 31 to dissipate the heat of the power element 71. Further, since the film is a porous film, the difference in thermal expansion between the insulating member 73 and the heat sink member 31 can be alleviated. This can result in prevention of peeling and cracking of the film and improvement in strength of thermal fatigue due to thermal cycles, so that the highly reliable power module 30 can be obtained.

Figure 3:
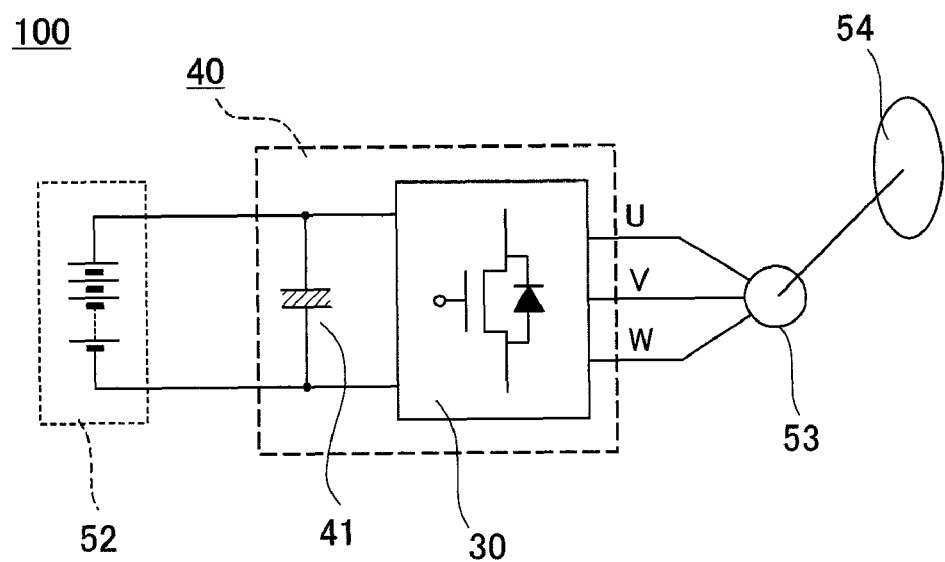
FIG. 3 is a schematic view of a vehicle inverter comprising the power module of the present embodiment, and a vehicle comprising the vehicle inverter.

FIG. 3 is a schematic view of a vehicle inverter 40 comprising the power module of the present embodiment and a vehicle 100 comprising the vehicle inverter. In FIG. 3, the inverter 40 of the embodiment is a power converter which is used in a hybrid vehicle using an engine and a motor, an electric automobile, or the like, converts a direct current to an alternating current, and supplies power to, for example, an alternating load of an induction motor or the like. The vehicle inverter 40 comprises the power module 30 of the embodiment as a minimum configuration, a large-capacity capacitor 41, and the like. A direct current power 52, such as a battery, is connected to the vehicle inverter 40, and three-phase alternating output of U/V/W from the vehicle inverter 40 is supplied to, for example, the induction motor 53 for driving this induction motor 53. Further, driven by the induction motor, wheels of the vehicle 100 rotate, to allow traveling of the vehicle 100. It is to be noted that the vehicle inverter 40 is not restricted to the example shown in the figure, but any mode can be applied so long as having a function as the inverter.

In the vehicle inverter 40 as thus configured, for example in the case of the power element 71 of the power module 30 of FIG. 2 coming into a high temperature state during its operation, a heat generated from the power element 71 is conducted to the insulating member 73 installed with the power element 71 through the solder layer 72, further conducted to the film as the buffer member 32 through the solder layer 76, and dissipated from the heat sink member 31 as a heat dissipation member. At this time, since the film having the porous structure is used as the buffer member 32, it functions as a cushion member to buffer a difference in thermal expansion between the insulating member 73 and the heat sink member 31. In such a manner, occurrence of peeling and cracking of these members can be suppressed so that the highly reliable vehicle inverter 40 can be obtained and the safety of the vehicle 100 can also be enhanced.

EXAMPLES

The present embodiment is described with reference to the following examples.

Example 1

A thermal conduction member was produced where a copper film had been formed on a substrate by cold spraying. Specifically, the air (atmospheric air) is compressed such that a density of the copper film was 7.8 kg/m³ (holes: 12% by volume), and a metal powder made of copper, which was in a solid-phase state, was sprayed to the surface of a heat sink member (substrate) made of an aluminum alloy of 30×20 mm in size and 5 mm in thickness (HS standard: A6063S-T1), along with the compressed air (compressed gas), so that a film was formed using the copper powder, and a thermal conduction member was produced.

Figure 6:
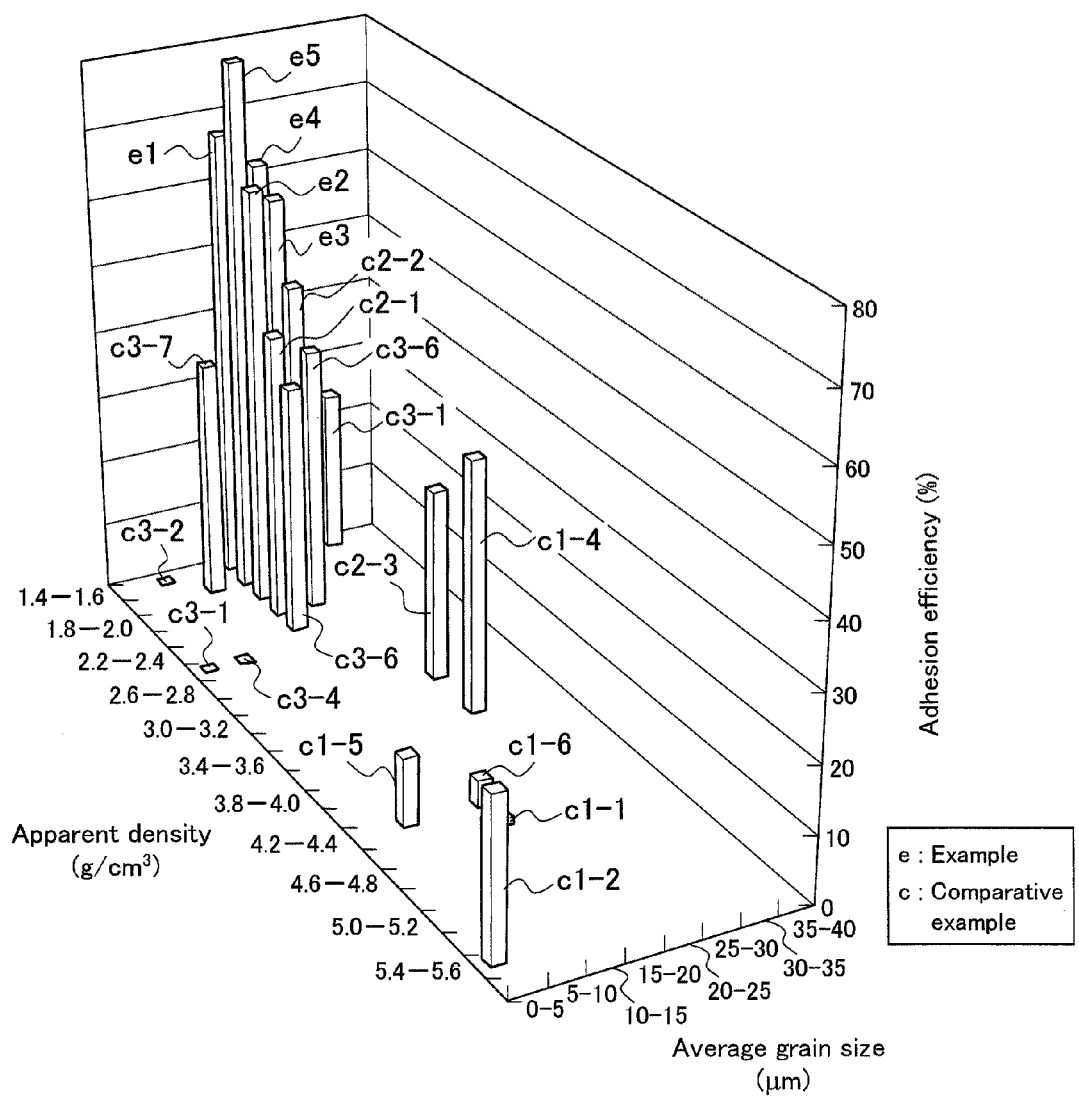
FIG. 6 is a view showing results on the adhesion efficiency relative to an apparent density and an average grain size.

A more detailed description is given below: a nozzle for spraying was arranged in a position 30 mm from the top of the heat sink member where surface processing had been performed by shot-blasting, through a masking plate having an opening for masking of 30×20 mm in size. Next, as shown in a table of FIG. 4, a copper powder for film formation was granulated from a water-atomized powder made of copper and having a grain size of 2 μm, so as to have an average grain size of 20 μm and an apparent density of 1.52 g/cm³. Then, the granulated copper powder for film formation was put into a hopper, and this copper powder was supplied to the nozzle at 0.2 g/sec. Meanwhile, the air (compressed gas) compressed to 0.6 MN was introduced to the nozzle, this compressed gas was heated by a heater inside the nozzle, the heated gas was supplied with the copper powder, and the copper powder in the solid-phase state was sprayed to the surface of the heat sink member along with the compressed gas on conditions of an air temperature of 450° C., a gas flow rate of 650 m/sec, and a rate of the copper powder of 300 msec. The nozzle was then shifted at a prescribed rate (3 mm/sec) with a pass pitch of 1 mm, to form a 3.2 mm film on the surface of the heat sink member, and a thermal conduction member was produced. At this time, a ratio of a weight of a powder having adhered to the substrate with respect to a weight of the powder sprayed thereto (adhesion efficiency) was measured. Results of the measurement are shown in FIGS. 4 and 6.

Examples 2 to 5

Figure 5:
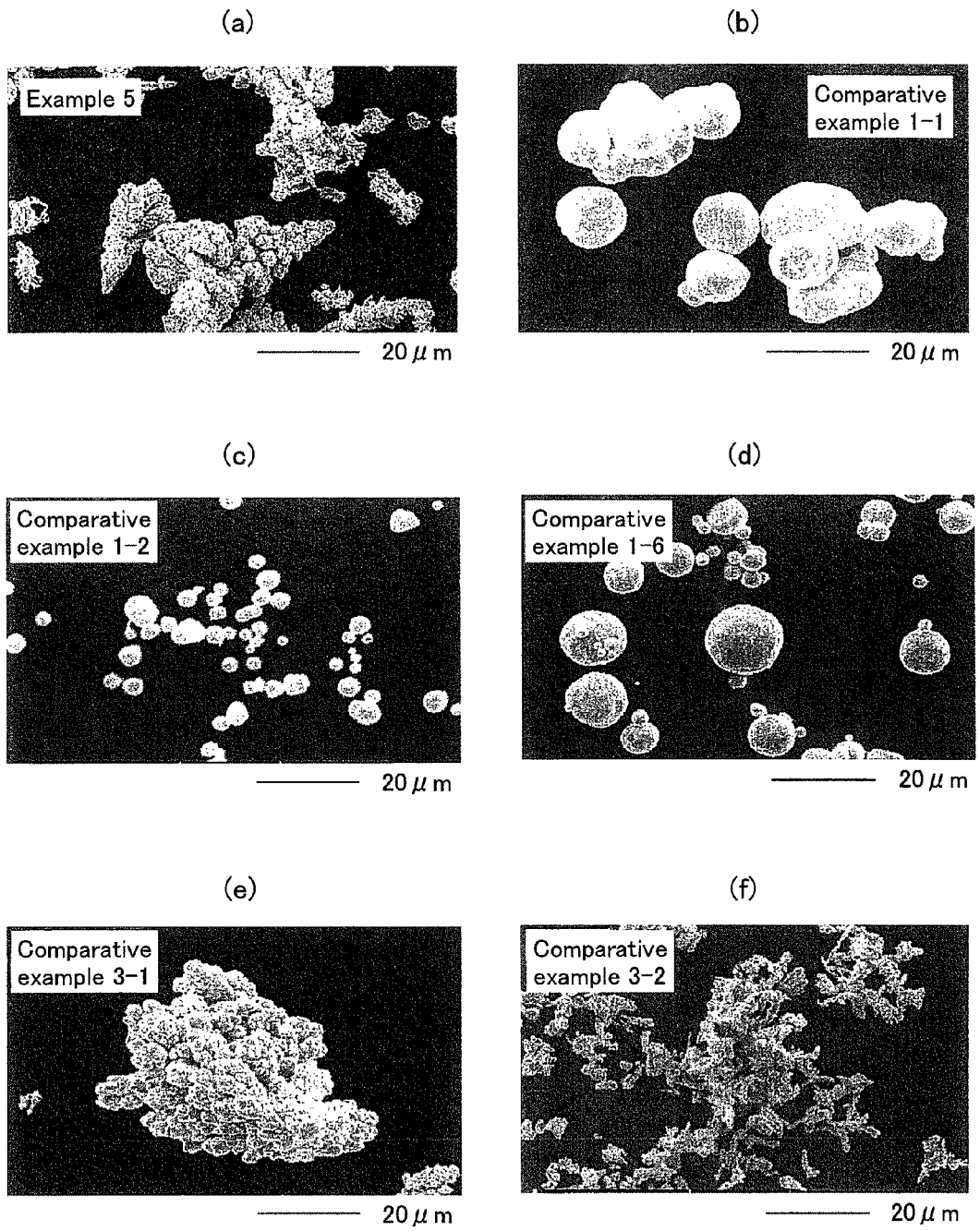
FIG. 5 is a photographic view representing appearance of a copper powder for film formation.

In the same manner as in Example 1, a film of the copper powder was formed on the surface of the substrate. A different point from Example 1 is a powder used at the time of film formation. Specifically, as shown in FIG. 4, in Example 2, a powder was used having been granulated from a gas-atomized powder, milled by a nitrogen gas, made of copper and having a grain size of 3 μm, so as to have an average grain size of 18 μm and an apparent density of 1.88 g/cm³ as a copper powder for film formation. In Examples 3 and 4, powders were used having been sequentially granulated from an electrolytic powder, made of copper and having a grain size of 4.8 μm, so as to have average grain sizes of 22 μm and 21 μm and dummy densities of 1.64 g/cm³ and 1.5 g/cm³, as copper powders for film formation. Further, in Example 5, a dendritic powder having an average grain size of 19.3 μm and an apparent density of 1.64 g/cm³, shown in FIG. 5(a) was used as an electrolytic powder. The adhesion efficiency of the copper powder was measured with respect to Examples 2 to 5. Results of the measurements are shown in FIGS. 4 and 6.

Comparative Examples 1-1 to 1-6

In the same manner as in Example 1, a film of the copper powder was formed on the surface of the substrate. A different point from Example 1 is a powder used at the time of film formation. Specifically, copper powders of Comparative Examples 1-1 to 1-6 are atomized powders (powders not granulated) having average grain sizes and dummy densities shown in FIG. 4. Specifically, in Comparative Examples 1-1 to 1-3, high-pressure swing water-atomized powders shown in the table of FIG. 4 (see FIG. 5(b) as for the powder of Comparative Example 1-1, and see FIG. 5(c) as for the powder of Comparative Example 1-2) were used. Further, in Comparative Examples 1-4 and 1-5, water-atomized powders were used, and in Comparative Example 1-6, a gas-atomized powder milled by a nitrogen gas (see FIG. 5(d) as for the powder of Comparative Example 1-6) was used. The adhesion efficiency of the copper powder was then measured with respect to Comparative Examples 1-1 to 1-6. Results of the measurement are shown in FIGS. 4 and 6.

Comparative Example 2-1 to 2-4

In the same manner as in Example 1, a film of the copper powder was formed on the surface of the substrate. A different point from Example 1 is a powder used at the time of film formation. Specifically, copper powders of Comparative Examples 2-1 to 2-4 are granulated powders having average grain sizes and dummy densities shown in the table of FIG. 4. Specifically, in Comparative Examples 2-1 and 2-2, water-atomized powders having average grain sizes shown in FIG. 4 were granulated so as to have the average grain sizes and the dummy densities shown in FIG. 4. In Comparative Examples 2-3 and 2-4, gas-atomized powders milled by a nitrogen gas and having average grain sizes shown in FIG. 4 were granulated so as to have the average grain sizes and the dummy densities shown in FIG. 4. The adhesion efficiency of the copper powder was then measured with respect to Comparative Examples 2-1 to 2-4. Results of the measurement are shown in FIGS. 4 and 6.

Comparative Example 3-1 to 3-7

In the same manner as in Example 1, a film of the copper powder was formed on the surface of the substrate. A different point from Example 1 is a powder used at the time of film formation. Specifically, copper powders of Comparative Examples 3-1 to 3-7 are electrolytic powders having average grain sizes and dummy densities shown in FIG. 4. The adhesion efficiency of the copper powder was then measured with respect to Comparative Examples. Results of the measurement are shown in FIGS. 4 and 6.

[Thermal Cycle Test]

Figure 7:
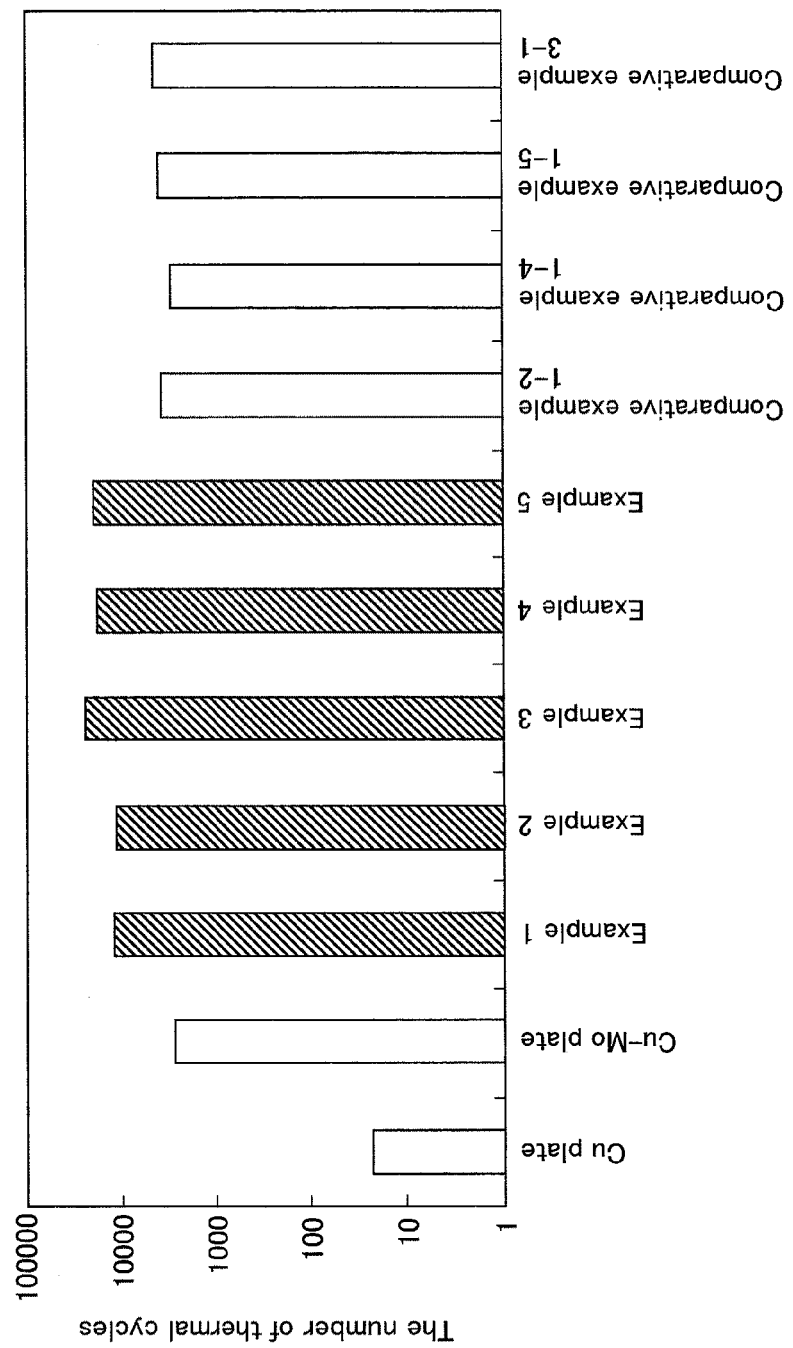
FIG. 7 is a view showing results of thermal cycle tests.

A thermal cycle test was performed such that an insulating member made of aluminum nitride was bonded by soldering to the film surface of the thermal conduction member of each of Examples 1 to 5 and Comparative Examples 1-2, 1-4, 1-5 and 3-1, to produce a specimen for a thermal cycle test, and a thermal load was repeatedly applied to the specimen in a temperature range with a prescribed temperature of not higher than 0° C. set as a lower limit temperature and with a prescribed temperature of not lower than 100° C. set as an upper limit temperature until the specimen was damaged. Further, as Referential Examples, a thermal conduction member was prepared such that, in place of the film, a copper plate (Cu plate) or a copper molybdenum plate (Cu—Mo plate) was bonded onto an aluminum substrate by use of a silicon grease, to produce a specimen in the same manner as above, and the thermal cycle test was conducted on the specimen. Results of the test are shown in FIG. 7. It is to be noted that an ordinate of FIG. 7 denotes the number of thermal cycles having been repeated at the time when damage on the thermal conduction member was confirmed. Further, poles formed in these films were observed and respective porosities were observed by contrast with one another.

(Result 1)

As shown in FIGS. 4 and 6, the copper powders of Examples 1 to 5 had higher adhesion efficiencies of substantially not lower than 60% than those of Comparative Examples. Further, as shown in FIG. 7, the films of Examples 1 to 5 had higher film porosities and higher thermal fatigue resistance, and were subjected to the larger number of thermal cycles, than those of Comparative Examples and Referential Example.

(Consideration 1)

As also apparent from FIG. 6, it is considered that as in Examples 1 to 5, a copper powder having an apparent density of 1.4 to 2.0 g/cm$^3$ and an average grain size of not larger than 25 µm has high adhesion efficiency even when the compressed gas has a low pressure (on the order of 0.4 to 1.0 MPa). A copper powder having an apparent density of 1.5 to 1.7 g/cm$^3$ and an average grain size of not larger than 20 µm has further higher adhesion efficiency, and especially in the case of using the electrolytic powder of Example 5, the highest adhesion efficiency is obtained. It is considered that producing a copper powder having an apparent density of less than 1.4 g/cm$^3$ is difficult to produce, and such a powder might be pulverized before collided with the substrate. It is considered that in the case of the apparent density being larger than 2.0 g/cm$^3$, on the other hand, since the density of the powder is large, with increase in grain size of the powder, it becomes more difficult to put the powder on a current of the compressed gas, and thereby, the adhesion efficiency of the powder to the substrate decreases. It is considered that, especially porous particles, such as granulated particles, or particles including many concave and convex portions and having spaces on the surface, such as a dendritic or botryoidal powder, are easily transformed by a small amount of pressure of the compressed gas, and thus have high adhesion efficiency. Further, it is considered that in the case of the average grain size being larger than 25 µm, sufficient kinetic energy (collision energy) cannot be provided to the powder, and thereby, the adhesion efficiency of the powder to the substrate decreases. It is considered that in the case of the average grain size of the powder being smaller than 1 µm, on the other hand, the adhesion efficiency of the powder may decrease since being affected by repercussions of the compressed gas sprayed to and reflected on the substrate.

Further, the reason for the high thermal fatigue strengths of the films of Examples of 1 to 5 is considered to be that the film was formed in the range of a porous film having a porosity of 5 to 50% by volume, and that the difference in thermal expansion between the substrate and the insulating member was suitably buffered, and the reason for the low thermal fatigue strengths in Comparative Examples 1-2, 1-4, 1-5 and 3-1 is considered to be that, although the porous film was formed, its porosity was small.

Example 6

Figure 8:
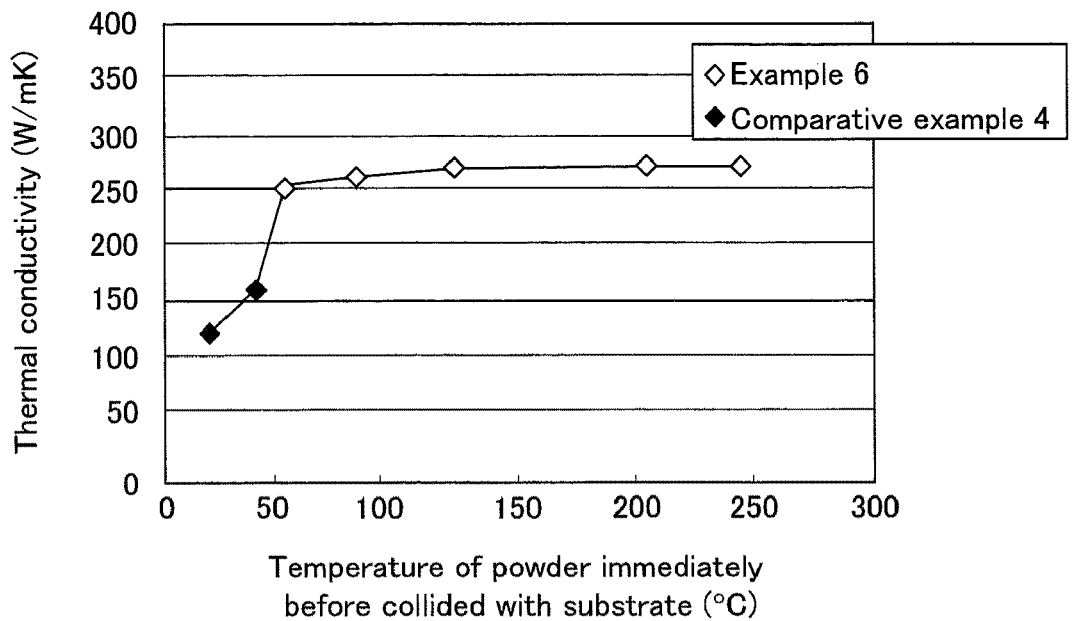
FIG. 8 is a view showing the relation between the temperature and the thermal conductivity of the copper powder immediately before spraying.

A thermal conduction member was produced in the same manner as in Example 1. A different point from Example 1 is that a film was formed on a temperature condition of the copper powder, immediately before collided with the substrate, of not lower than 50° C., shown in FIG. 8. A thermal conductivity of the film was then measured in the same manner as in Example 1. Results of the measurement are shown in FIG. 8.

Comparative Example 4

A thermal conduction member was produced in the same manner as in Example 1. A different point from Example 1 is that the film was formed on temperature condition of the copper powder, immediately before collided with the substrate, of not lower than 50° C., shown in FIG. 8. A thermal conductivity of the film was then measured in the same manner as in Example 1. Results of the measurement are shown in FIG. 8.

(Result 2)

As shown in FIG. 8, the thermal conductivity is high in Example 6 as compared with Comparative Example 4, and the film formed at any temperature not lower than 50° C. had a stable thermal conductivity.

(Consideration 2)

As thus described, it is considered that the temperature of the copper powder immediately before collided with the substrate is preferably set to not lower than 50° C. in order to obtain a stable thermal conductivity. It is considered that the conductivity of the film was improved due to an increase in proportion of metallic bond in the film, and the metallic bond increased due to an increase in energy at the time of film formation by heating of the copper powder.

Although one embodiment of the present invention was detailed in the above, the present invention is not restricted to the above embodiment, and a variety of design changes can be made in a range not deviating from the spirit of the present invention described in the claims.

For example, although the copper powder was used in the present embodiment, examples of the powder for use include a powder of a copper alloy, and powders of aluminum, chrome, nickel, copper and iron powders, and an alloy of these, and the powder for use is not particularly restricted so long as being able to form a film with a porous structure. Further, although aluminum was used for the substrate, the material for the substrate is not particularly restricted so long as being able to ensure adhesiveness of the metal powder.

INDUSTRIAL APPLICABILITY

Since a member where a film was formed by the film forming method according to the present invention has good thermal conductance, the member is suitably used as the thermal conduction member. Further, the film is suitably formed in a place required to have heat dissipation properties under severe temperature circumstances, such as an engine part, a CPU of a computer, audio equipment for a vehicle, and home electric appliances. Moreover, since providing high adhesion efficiency, the film may be suitably formed for coating the surface of a member required to have good design properties such as an ornament.

The invention claimed is:

1. A film forming method of spraying a metal powder in a solid-phase state to a surface of a substrate along with a compressed gas, to form a film from the metal powder on the surface of the substrate,
characterized in that a powder, which at least contains a powder for film formation having an apparent density of 1.4 to 2.0 g/cm$^3$ and an average grain size of not larger than 25 μm, is used as the metal powder;
wherein the metal powder is made from at least one material selected from aluminum, nickel, copper, iron and alloys thereof.

2. The film forming method according to claim 1, characterized by using, as the powder for film formation, a granulated powder granulated from a powder not larger than 10 μm.

3. The film forming method according to claim 2, characterized by using a gas-atomized powder, a water-atomized powder or an electrolytic powder as a granulated powder to be granulated into the powder for film formation.

4. The film forming method according to claim 1, characterized by using a powder of copper or a copper alloy as the metal powder.

5. The film forming method according to claim 1, characterized by using, as the metal powder a metal powder containing not less than 60% by mass of the powder for film formation.

6. The film forming method according to claim 1, characterized by using, as the compressed gas, a compressed gas having a pressure of 0.4 to 1.0 MPa.

7. The film forming method according to claim 4, characterized by heating the metal powder to be sprayed to a temperature of not lower than 50° C. such that the metal powder remains in a solid phase when sprayed to the surface of the substrate.

8. A thermal conduction member where the film is formed on the surface of the substrate by the film forming method according to claim 1,
characterized in that the film is a porous film having a porosity of 5 to 50% by volume.

9. A power module, comprising the thermal conduction member according to claim 8, characterized in that
the substrate of the thermal conduction member is a heat sink member constituting the power module, and
the film of the thermal conduction member is arranged between an insulating member, mounted with a power element constituting the power module, and the heat sink member.

10. A vehicle inverter, comprising the power module according to claim 9.

11. A vehicle, comprising the vehicle inverter according to claim 10.

12. The film forming method according to claim 1, characterized in that the metal powder is an electrolytic powder produced by depositing the metal constituting the metal powder on an electrode through use of electrolysis.

* * * * *

UNITED STATES PATENT AND TRADEMARK OFFICE
CERTIFICATE OF CORRECTION

PATENT NO.        : 8,025,921 B2
APPLICATION NO.   : 12/443055
DATED             : September 27, 2011
INVENTOR(S)       : Noritaka Miyamoto et al.

It is certified that error appears in the above-identified patent and that said Letters Patent is hereby corrected as shown below:

Title Page Item (12) should read Miyamoto.

Title Page 1 of the Letters Patent, Item No. (75), please correct the first inventor's name as follows: Noritaka ~~Miyamato~~ Miyamoto.

Title Page 1 of the Letters Patent, Item No. (87), please correct the PCT Publication Number as follows: ~~WO2008/156903~~ WO2008/156093.

Signed and Sealed this
Third Day of April, 2012

David J. Kappos
*Director of the United States Patent and Trademark Office*